(12) United States Patent
Zheng et al.

(10) Patent No.: US 12,040,764 B2
(45) Date of Patent: Jul. 16, 2024

(54) HYBRID COMPENSATION SYSTEM AND CONTROL METHOD THEREOF

(71) Applicant: Delta Electronics (Shanghai) Co., Ltd., Shanghai (CN)

(72) Inventors: Jianfei Zheng, Shanghai (CN); Lan Wei, Shanghai (CN); Binbin Dong, Shanghai (CN); Jianping Ying, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 85 days.

(21) Appl. No.: 18/071,755

(22) Filed: Nov. 30, 2022

(65) Prior Publication Data

US 2023/0238943 A1    Jul. 27, 2023

(30) Foreign Application Priority Data

Jan. 27, 2022 (CN) .......................... 202210101605.4

(51) Int. Cl.
| | |
|---|---|
| *H02J 3/01* | (2006.01) |
| *H02J 3/18* | (2006.01) |
| *H03H 7/01* | (2006.01) |
| *H03H 11/04* | (2006.01) |

(52) U.S. Cl.
CPC .............. *H03H 11/04* (2013.01); *H02J 3/01* (2013.01); *H02J 3/18* (2013.01); *H03H 7/0153* (2013.01); *Y02E 40/40* (2013.01)

(58) Field of Classification Search
CPC ..... H02J 3/01; H02J 3/18; H03H 7/01; H03H 7/0153; H03H 11/04; Y02E 40/40

USPC ........................................................ 307/105
See application file for complete search history.

(56) References Cited

U.S. PATENT DOCUMENTS

| | | | | |
|---|---|---|---|---|
| 5,548,165 | A * | 8/1996 | Mohan ................... | H02M 1/12 363/39 |
| 5,731,965 | A | 3/1998 | Cheng et al. | |
| 2011/0057517 | A1 * | 3/2011 | Zhang ..................... | H02J 3/01 307/105 |

FOREIGN PATENT DOCUMENTS

| | | |
|---|---|---|
| CN | 104505834 B | 8/2016 |
| CN | 105048463 B | 4/2017 |
| CN | 108390384 A | 8/2018 |

* cited by examiner

*Primary Examiner* — William Hernandez
(74) *Attorney, Agent, or Firm* — KIRTON McCONKIE; Evan R. Witt

(57) ABSTRACT

A hybrid compensation system is electrically connected between a power grid and a load. The hybrid compensation system includes an active filter, a passive filter and a control unit. The active filter generates an output current. The active filter includes a switching circuit, a DC bus capacitor and a filtering inductor. The control unit includes a voltage controller, a first reactive current detector, a harmonic current compensator, a current loop controller and a modulator. The voltage controller generates a first current given signal according to a bus voltage of the DC bus capacitor and a reference voltage. The first reactive current detector generates a second current given signal. The harmonic current compensator generates a third current given signal. The current loop controller generates a control signal. The modulator generates a driving signal according to the control signal.

28 Claims, 12 Drawing Sheets

HYBRID COMPENSATION SYSTEM AND CONTROL METHOD THEREOF

CROSS-REFERENCE TO RELATED APPLICATION

This application claims priority to China Patent Application No. 202210101605.4, filed on Jan. 27, 2022. The entire content of the above-mentioned patent application is incorporated herein by reference for all purposes.

FIELD OF THE INVENTION

The present disclosure relates to a compensation system and a control method of the compensation system, and more particularly to a hybrid compensation system with an active filter and a passive filter and a control method for the hybrid compensation system.

BACKGROUND OF THE INVENTION

For improving the power quality, the power supply connected with a power grid is equipped with an active filter for compensating the reactive power and harmonics of a load. Alternatively, a hybrid compensation system is used to compensate the reactive power and harmonics of the load in order to reduce the system cost. The hybrid compensation system includes an active filter and a passive filter connected in parallel. For example, in case that the hybrid compensation system with the passive filter and the active filter in 1:1 arrangement is used, the cost is reduced by about 30% compared with the power supply using the active filter only.

Generally, the capacitor in the passive filter of the hybrid compensation system or the capacitive load may form a resonance point with the impedance on the grid. For suppressing the resonance point, a conventional method is provided to control the active filter. That is, a virtual resistor is formed in the hybrid compensation system to suppress the resonance point. Since the method of using the active filter in the hybrid compensation system to suppress the resonance point is implemented according to the sampling current between the power grid and the load, some drawbacks occur. For example, in case that the sampling position of the sampling current between the power grid and the load is different and the connection location between the active filter and the passive filter is different, the hybrid compensation system has high system stability but low compensation accuracy. Alternatively, the hybrid compensation system has high compensation accuracy, but the control parameters tuning process is difficult and the stability margin is low. If the resonance phenomenon occurs, the compensation effect is impaired.

For solving the drawbacks of the conventional technologies, the present disclosure provides an improved hybrid compensation system and a control method thereof.

SUMMARY OF THE INVENTION

The present disclosure provides a hybrid compensation system and a control method for the hybrid compensation system. By the hybrid compensation system and the control method, the stability margin is increased. Even if the parameters of the hybrid compensation system are subjected to changes (e.g., the capacitor is loaded in or loaded out or the grid impedance is changed), the hybrid compensation system can be kept stable according to the suitable phase compensation signal without adjusting the control parameters of the control unit. Consequently, the hybrid compensation system has strong adaptability to the changes of the power grid and the load, and improves the current compensation accuracy.

In accordance with an aspect of the present disclosure, a hybrid compensation system is provided. The hybrid compensation system is electrically connected between a power grid and a load. The hybrid compensation system includes an active filter, a passive filter and a control unit. The active filter generates an output current. The active filter includes a switching circuit, a DC bus capacitor and a filtering inductor. The passive filter is connected with the active filter in parallel. The control unit controls the active filter. The control unit includes a voltage controller, a first reactive current detector, a harmonic current compensator, a current loop controller and a modulator. The voltage controller generates a first current given signal according to a bus voltage of the DC bus capacitor and a reference voltage of the DC bus capacitor. The first reactive current detector generates a second current given signal according to at least one sampling current and a fundamental wave phase signal of a grid voltage of the power grid. The at least one sampling current is related to a current flowing between the power grid and the load. The harmonic current compensator generates a third current given signal according to the at least one sampling current, the fundamental wave phase signal and at least one phase compensation signal. The current loop controller generates a control signal according to the first current given signal, the second current given signal, the third current given signal, the output current of the active filter and a voltage signal of the power grid. The modulator generates a driving signal according to the control signal. The switching circuit is controlled by the driving signal. Consequently, the active filter generates and adjusts the output current.

In accordance with another aspect of the present disclosure, a control method for a control unit of a hybrid compensation system is provided. The hybrid compensation system is electrically connected between a power grid and a load. The hybrid compensation system includes an active filter, a passive filter and the control unit. The active filter generates an output current. The active filter includes a switching circuit, a DC bus capacitor and a filtering inductor. The passive filter and the active filter are connected with the passive filter in parallel. The active filter is controlled by the control unit. The control method includes following steps. In a step (S1), a first current given signal is generated according to a bus voltage of the DC bus capacitor and a reference voltage of the DC bus capacitor. In a step (S2), a second current given signal is generated according to at least one sampling current and a fundamental wave phase signal of a grid voltage of the power grid. The at least one sampling current is related to a current flowing between the power grid and the load. In a step (S3), a third current given signal is generated according to the at least one sampling current, the fundamental wave phase signal and at least one phase compensation signal. In a step (S4), a control signal is generated according to the first current given signal, the second current given signal, the third current given signal, the output current of the active filter and a voltage signal of the power grid. In a step (S5), a driving signal is generated according to the control signal. The switching circuit is controlled by the driving signal. Consequently, the active filter generates and adjusts the output current. The steps (S1), (S2) and (S3) are performed in any order.

The above contents of the present disclosure will become more readily apparent to those ordinarily skilled in the art after reviewing the following detailed description and accompanying drawings, in which:

BRIEF DESCRIPTION OF THE DRAWINGS

FIG. 8 is a simulation diagram illustrating the waveforms of the associated signals when the 11-th harmonic wave is compensated by a conventional hybrid compensation system without introducing the phase compensation and the capacitive passive filter is loaded in;

FIG. 10 is a simulation diagram illustrating the waveforms of the associated signals when the 11-th harmonic wave is compensated by the present hybrid compensation system introducing the phase compensation and the capacitive passive filter is loaded in;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
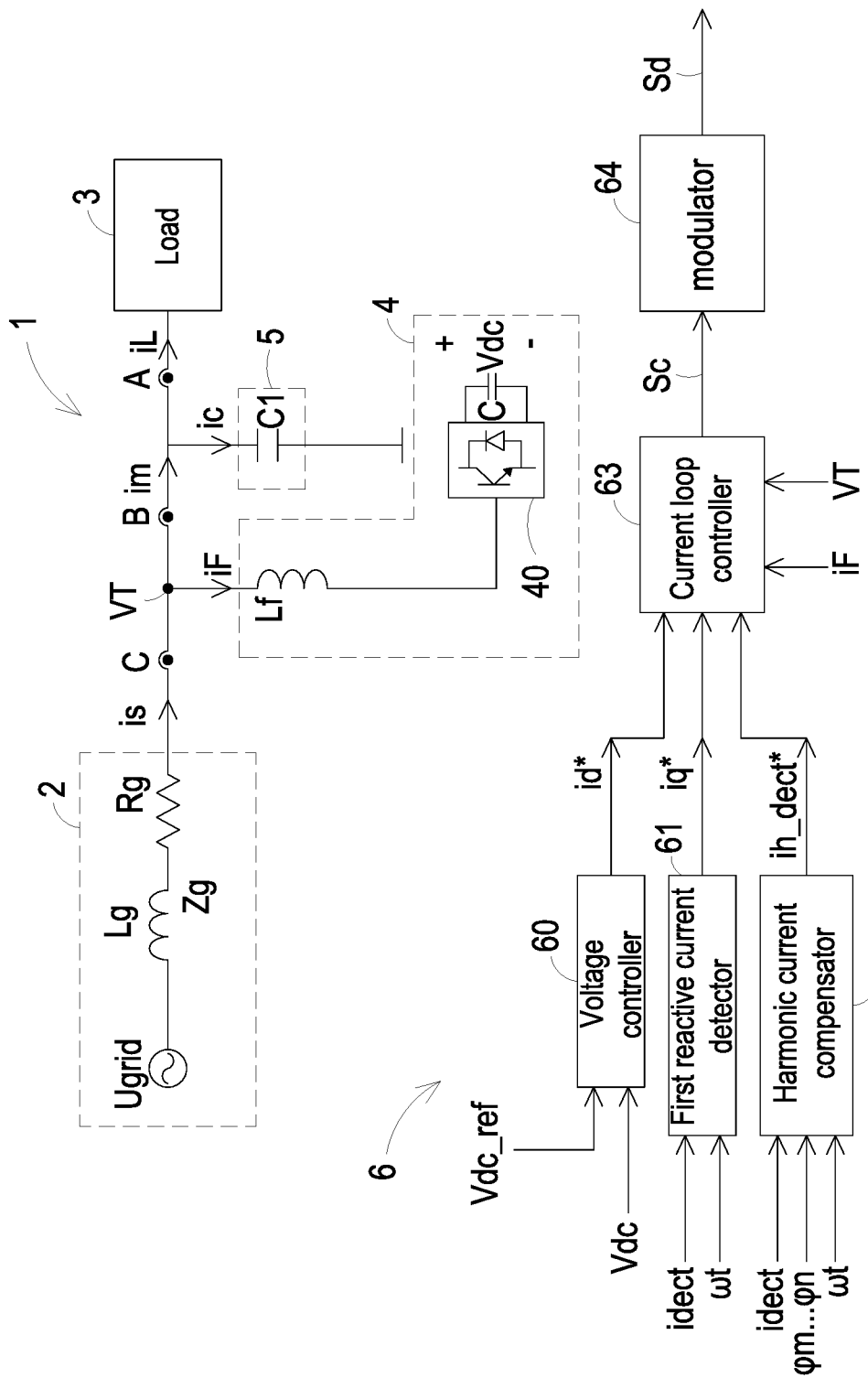
FIG. 1 schematically illustrates the architecture of a hybrid compensation system and a control unit of the hybrid compensation system according to a first embodiment of the present disclosure.

Please refer to FIG. 1. FIG. 1 schematically illustrates the architecture of a hybrid compensation system and a control unit of the hybrid compensation system according to a first embodiment of the present disclosure. The hybrid compensation system 1 is electrically connected between a power grid 2 and a load 3. The power grid 2 and the load 3 are connected with each other through a transmission line. The load 3 comprises a linear load and a nonlinear load. The hybrid compensation system 1 is connected to the transmission line. That is, the hybrid compensation system 1 is electrically connected with the power grid 2 and the load 3 through the transmission line. The hybrid compensation system 1 is used to detect the reactive component of the current in the transmission line and the harmonic component caused by distortion. Moreover, the hybrid compensation system 1 further compensates the current in the transmission line according to the detection result. Consequently, the reactive component and the harmonic component are suppressed, and the power factor is increased. In an embodiment, the hybrid compensation system 1 includes an active filter 4, a passive filter 5 and a control unit 6.

The active filter 4 is electrically connected with the transmission line. Moreover, the active filter 4 is electrically connected with the power grid 2 and the load 3 through the transmission line. The active filter 4 generates an output current iF to compensate the current in the transmission line. In an embodiment, the active filter 4 includes a switching circuit 40, a DC bus capacitor C and a filtering inductor Lf. The DC bus capacitor C and the filtering inductor LF are electrically connected with the switching circuit 40. Preferably but not exclusively, the active filter 4 is an active power filter (APF), a static var generator (SVG), or a static synchronous compensator (Statcom). In the embodiment of FIG. 1, the active filter 4 is an active power filter (APF).

The passive filter 5 is electrically connected with the transmission line. That is, the passive filter 5 is electrically connected with the active filter 4 and the load 3 through the transmission line. The passive filter 5 includes a filtering capacitor and/or a filtering inductor. In the embodiment of FIG. 1, the passive filter 5 includes a filtering capacitor C1.

The control unit 6 is electrically connected with the active filter 4 to control the operation of the switching circuit 40 of the active filter 4. In an embodiment, the control unit 6 includes a voltage controller 60, a first reactive current detector 61, a harmonic current compensator 62, a current loop controller 63 and a modulator 64.

The voltage controller 60 receives a reference voltage Vdc_ref and a bus voltage Vdc of the DC bus capacitor C. Moreover, the voltage controller 60 generates a first current given signal id* according to the reference voltage Vdc_ref and the bus voltage Vdc of the DC bus capacitor C.

The first reactive current detector 61 receives a sampling current idect and a fundamental wave phase signal ωt of a grid voltage of the power grid 2. Moreover, the sampling current idect is related to the current in the transmission path between the power grid 2 and load 3. The first reactive current detector 61 generates a second current given signal iq* according to the sampling current idect and the fundamental wave phase signal wt. In an embodiment, the hybrid compensation system 1 further includes a phase-locked loop PLL (not shown). The phase-locked loop PLL is used to detect the instant voltage value of the power grid 2 and calculate the fundamental wave phase signal wt of the grid voltage of the power grid 2.

The harmonic current compensator 62 generates a third current given signal ih_dect* according to the sampling current idect, the fundamental wave phase signal wt and at least one phase compensation signal φm . . . φn.

The current loop controller 63 generates a control signal Sc according to the first current given signal id*, the second current given signal iq*, the third current given signal ih_dect*, the output current iF from the active filter 4 and a voltage signal VT of the power grid 2. Moreover, the voltage signal VT of the power grid 2 is a detected value of the grid voltage at the grid-connected node of the active filter 4.

The modulator 64 generates a driving signal Sd (e.g., a PWM driving signal) according to the control signal Sc. The operation of the switching circuit 40 is controlled according to the driving signal Sd. Consequently, the output current iF is generated and adjusted by the active filter 4.

Figure 2:
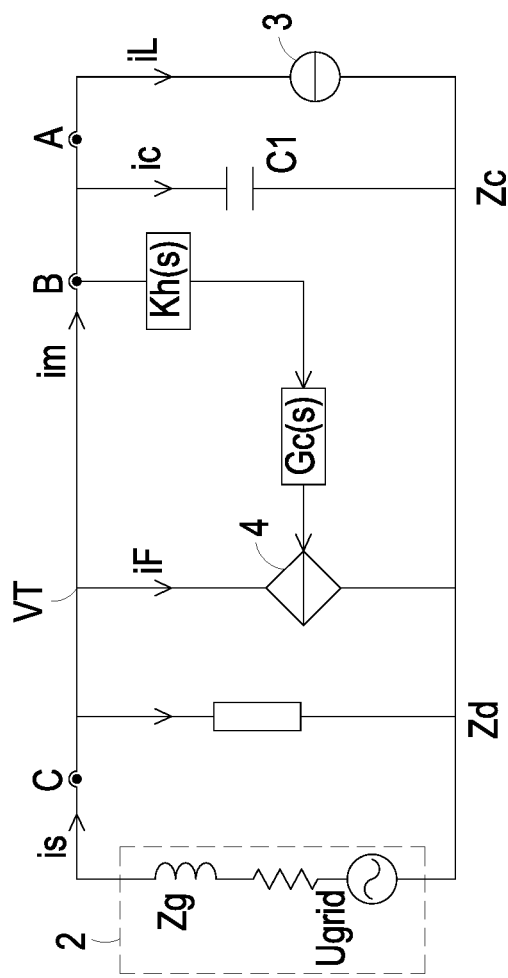
FIG. 2 is a schematic equivalent circuit of the hybrid compensation system, the power grid and the load when the current in the transmission line between the active filter and the passive filter (i.e., the B-point current im) is sampled as the sampling current.
Figure 3:
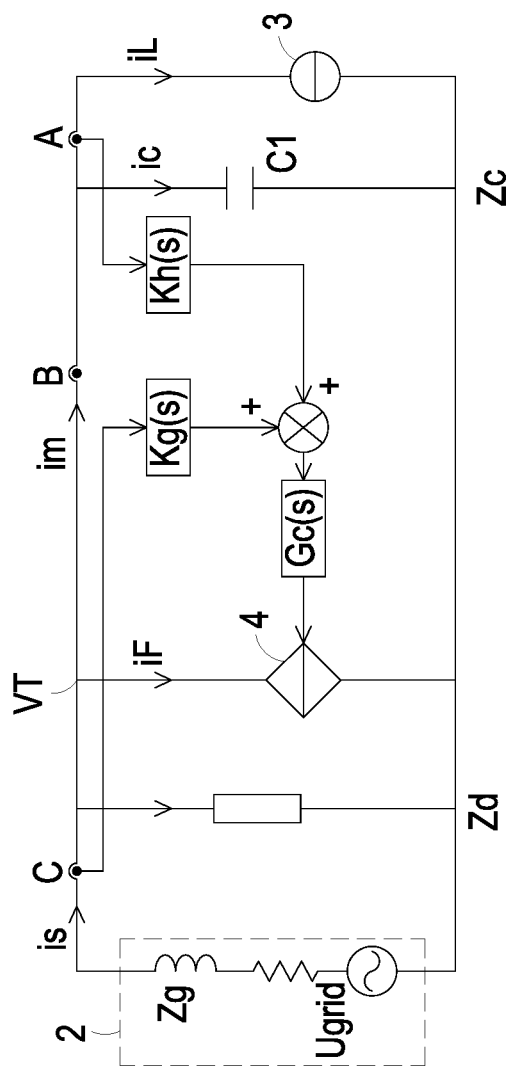
FIG. 3 is a schematic equivalent circuit of the hybrid compensation system, the power grid and the load when the grid current and the load current are sampled as the sampling current.

The operating principles of the hybrid compensation system 1 will be described as follows. Please refer to FIGS. 2 and 3. FIG. 2 is a schematic equivalent circuit of the hybrid compensation system, the power grid and the load when the current in the transmission line between the active filter and the passive filter (i.e., the B-point current im) is sampled as the sampling current. FIG. 3 is a schematic equivalent circuit of the hybrid compensation system, the power grid and the load when the current in the transmission line between the hybrid compensation system and the grid (i.e., the C-point current is) and the current in the transmission line between the hybrid compensation system and the load (i.e., the A-point current iL) are sampled as the sampling current.

Please refer to FIG. 2. The current in the transmission line between the active filter 4 and the passive filter 5 is sampled as the sampling current idect. That is, the current at the point B (also referred as the B-point current im) is the sampling current idect. The relationship between a grid current (is) flowing through the power grid 2 and a load current iL flowing through the load 3 may be expressed by the following mathematic formula (1):

$$\frac{i_s(s)}{i_L(s)} = \frac{[1 + G_c(s)K_h(s)]\frac{z_c \,//\, z_d}{z_c \,//\, z_d + z_g}}{1 + G_c(s)K_h(s)\frac{z_g \,//\, z_d}{z_c + z_g \,//\, z_d}} \quad (1)$$

In the above mathematic formula, is(s) is the Laplace transform of the grid current (is), $i_L(s)$ is the Laplace transform of the load current iL, $G_c(s)$ is the current loop closed-loop transfer function of the active filter 4, $K_h(s)$ is the harmonic extraction and given current generation link transfer function of the load current iL, $Z_d$ is an equivalent impedance introduced by the virtual resistor of the hybrid compensation system 1, $Z_c$ is an equivalent impedance of the passive filter 5, and $Z_g$ is the grid impedance of the power grid 2. Moreover, $Z_g = R_g + j\omega L_g$, wherein ω is the angular frequency of the grid voltage. Due to the harmonic extraction and given current generation link transfer function $K_h(s)$, the output current is of the passive filter 5 and the output current iF of the active filter 4 are correlated with each other. Consequently, the outer loop of the current loop of the active filter 4 is formed. If the outer loop of the current loop of the active filter 4 forms a positive feedback, the stability of the hybrid compensation system 1 will be deteriorated. For example, if the denominator of the mathematic formula (1) is equal to or close to 0, the hybrid compensation system 1 will resonate, resulting in the instability of the hybrid compensation system 1.

Please refer to FIG. 3. The current in the transmission line between the hybrid compensation system and the power grid 2 (i.e., the grid current (is)) and the current in the transmission line between the hybrid compensation system 1 and the load 3 (i.e., the load current iL) are sampled as the sampling current idect. The grid current (is) is also referred as the C-point current. The load current iL is also referred as the A-point current. The relationship between the grid current (is) and the load current iL may be expressed by the following mathematic formula (2):

$$\frac{i_s(s)}{i_L(s)} = \frac{[1 + G_c(s)K_h(s)]\frac{z_c \,//\, z_d}{z_c \,//\, z_d + z_g}}{1 - G_c(s)K_g(s)\frac{z_c \,//\, z_d}{z_c + z_d \,//\, z_g}} \quad (2)$$

In the above mathematic formula, $K_g(s)$ is the harmonic extraction and given current generation link transfer function of the grid current (is). Due to the harmonic extraction and given current generation link transfer function $K_g(s)$, the grid current (is) and the output current iF of the active filter 4 are correlated with each other. Consequently, the outer loop of the current loop of the active filter 4 is formed. If the outer loop of the current loop of the active filter 4 forms a positive feedback, the stability of the hybrid compensation system 1 will be deteriorated. For example, if the denominator of the mathematic formula (2) is equal to or close to 0, the hybrid compensation system 1 will resonate, resulting in the instability of the hybrid compensation system 1.

As mentioned above, the stability of hybrid compensation system 1 is related to the denominator. Take the mathematic formula (2) as an example. The LC impedance network $$\frac{z_c \,//\, z_d}{z_c \,//\, z_d + z_g}$$

and the current loop closed-loop transfer function $G_c(s)$ of the active filter 4 can be regarded as a low-pass filter, i.e., a function of frequency. As the harmonic order increases, the phase lag introduced into the loop increases. Consequently, the phase stability margin of the hybrid compensation system 1 decreases, and the risk of generating resonance increases. For overcoming the above drawbacks, the hybrid compensation system 1 of the present disclosure refers to the phase compensation introduced at the resonant frequency to be compensated and the harmonics above the resonant frequency to be compensated, and the at least one phase compensation signal φm . . . φn is provided to the harmonic current compensator 62. For example, in FIG. 2, the phase of the phase compensation signal $$G_c \frac{z_g \,//\, z_d}{z_g \,//\, z_d + z_c}$$

is introduced into the harmonic extraction and given current generation link transfer function $K_h(s)$. Similarly, in FIG. 3, the phase of the phase compensation signal $$-G_c \frac{z_c \,//\, z_d}{z_c \,//\, z_d + z_g}$$

is introduced into the harmonic extraction and given current generation link transfer function $K_g(s)$. Consequently, the harmonic current compensator 62 generates the third current given signal ih_dect* according to the sampling current idect and the at least one phase compensation signal φm ... φn. In this way, the denominator of the mathematic formula (3) and the denominator of the mathematic formula (2) are not equal to 0.

The control unit 6 generates the driving signal Sd according to the at least one phase compensation signal φm ... φn. Consequently, the stability of the hybrid compensation system 1 is enhanced, and the stability margin becomes wider. Moreover, regardless of whether the grid impedance of the power grid 2 is changed, or the capacitive component of the load 3 is loaded in or out, or the passive filter 5 is loaded in or out, the hybrid compensation system 1 is kept stable without the need of adjusting the control parameters of the control unit 6. In other words, the hybrid compensation system 1 of the present disclosure has strong adaptability to the changes of the power grid 2, the load 3 and the passive filter 5, and improves the current compensation accuracy.

In the embodiment of FIG. 1, the passive filter 5 is electrically connected between the active filter 4 and the load 3, and the active filter 4 is electrically connected between the power grid 2 and the passive filter 5. It is noted that numerous modifications and alterations may be made while retaining the teachings of the disclosure. For example, in another embodiment, the active filter 4 is electrically connected between the passive filter 5 and the load 3, and the passive filter 5 is electrically connected between the power grid 2 and the active filter 4.

In an embodiment, the sampling current idect received by the first reactive current detector 61 contains a first sampling current. The first sampling current is acquired by sampling the current in the transmission path between the power grid 2 and the hybrid compensation system 1. For example, the first sampling current is the current flowing through the point C (i.e., the C-point current). That is, the first sampling current is the grid current (is) from the power grid 2. The grid current (is) is the sum of the output current iF of the active filter 4, the load current iL of the load 3 and the output current ic of the passive filter 5. It is noted that the way of acquiring the first sampling current is not restricted. In another embodiment, after the output current iF of the active filter 4, the load current iL of the load 3 and the output current ic of the passive filter 5 are sampled, these sampled results are superposed with each other to obtain the first sampling current.

In an embodiment, the sampling current idect received by the first reactive current detector 61 contains a second sampling current. The second sampling current is acquired by sampling the current in the transmission path between the active filter 4 and the passive filter 5. For example, the second sampling current is the current flowing through the point B (i.e., the B-point current). That is, the second sampling current is the B-point current im. The B-point current im is the sum of the load current iL of the load 3 and the output current ic of the passive filter 5. It is noted that the way of acquiring the second sampling current is not restricted. In another embodiment, after the load current iL of the load 3 and the output current ic of the passive filter 5 are sampled, these sampled results are superposed with each other to obtain the second sampling current.

In an embodiment, the at least one phase compensation signal includes a plurality of phase compensation signals φm ... φn, wherein m 2, n m, and n and m are positive integers. The harmonic current compensator 62 receives the sampling current idect and the plurality of phase compensation signals and extracts the m-th to the n-th order harmonic waves in the sampling current idect. Moreover, the m-th to the n-th order harmonic waves are compensated according to the plurality of phase compensation signals.

Figure 4A:
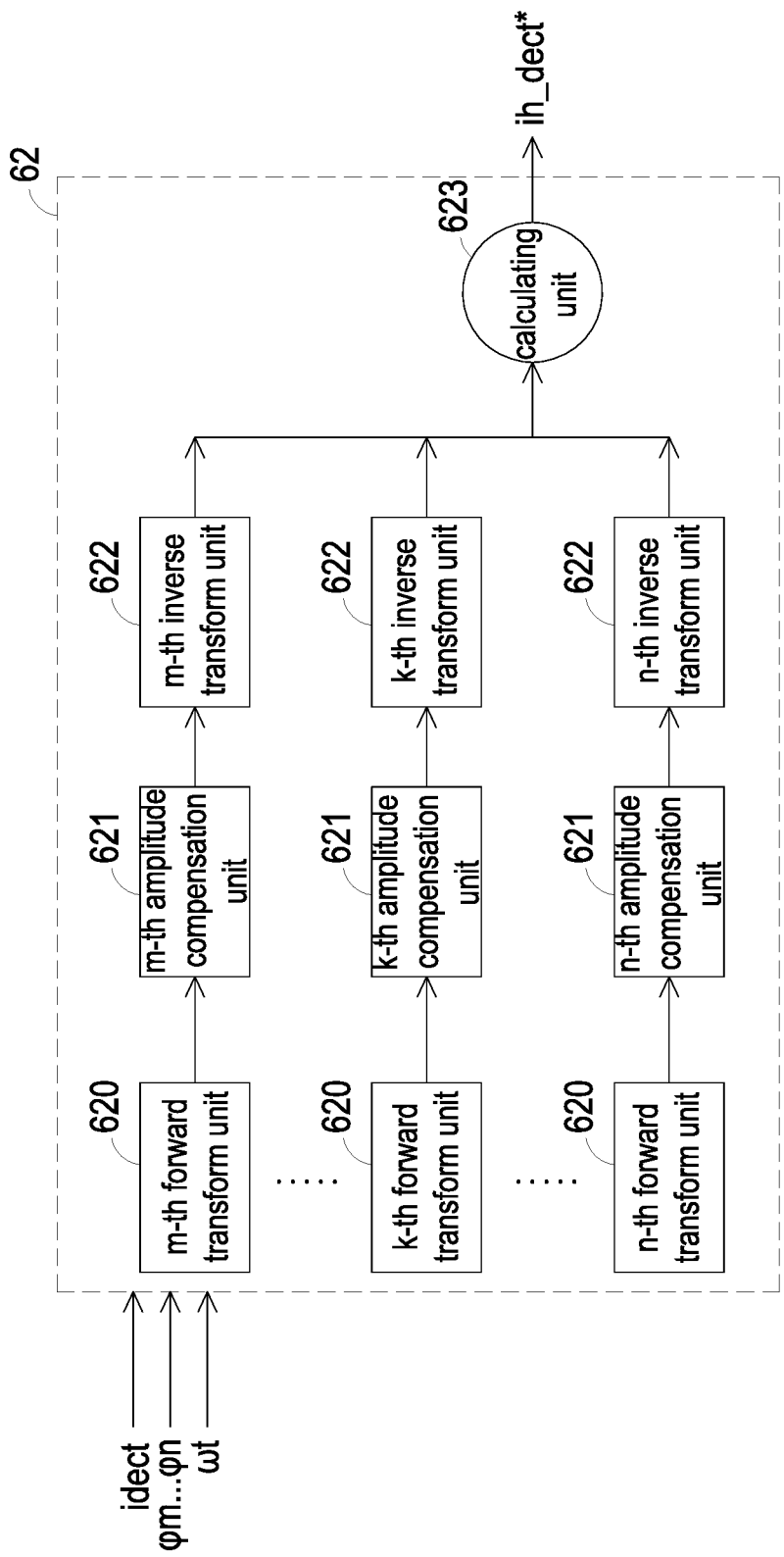
FIG. 4A is a schematic circuit block diagram illustrating a first exemplary architecture of the harmonic current compensator of the hybrid compensation system as shown in FIG. 1.
Figure 4B:
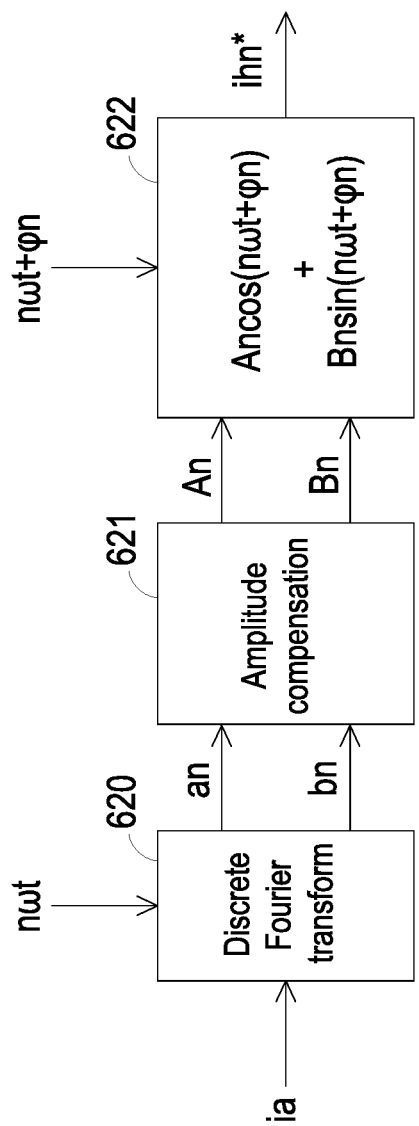
FIG. 4B schematically illustrates the computing structure of a forward transform unit, an amplitude compensation unit and an inverse transform unit of the harmonic current compensator as shown in FIG. 4A.

Please refer to FIGS. 4A and 4B. FIG. 4A is a schematic circuit block diagram illustrating a first exemplary architecture of the harmonic current compensator of the hybrid compensation system as shown in FIG. 1. FIG. 4B schematically illustrates the computing structure of a forward transform unit, an amplitude compensation unit and an inverse transform unit of the harmonic current compensator as shown in FIG. 4A. In an embodiment, the harmonic current compensator 62 includes the m-th to the n-th forward transform units 620, the m-th to the n-th amplitude compensation units 621, the m-th to the n-th inverse transform units 622 and a calculating unit 623. The at least one phase compensation signal includes a plurality of phase compensation signals φm ... φn. That is, the harmonic current compensator 62 receives the m-th to the n-th phase compensation signals φm ... φn. Moreover, the operations of the m-th to the n-th forward transform units 620 are similar, the operations of the m-th to the n-th amplitude compensation units 621 are similar, and the operations of the m-th to the n-th inverse transform units 622 are similar.

In the m-th to the n-th forward transform units 620, the k-th forward transform unit 620 generates the k-th forward transform signal according to the sampling current idect and k times the fundamental wave phase signal ωt, wherein k is a positive integer, m 2, and n k m.

In the m-th to the n-th amplitude compensation units 621, the k-th amplitude compensation unit 621 generates the k-th amplitude compensation signal according to the k-th forward transform signal.

In the m-th to the n-th inverse transform units 622, the k-th inverse transform unit 622 generates the k-th harmonic current given signal according to the k-th amplitude compensation signal, k times the fundamental wave phase signal ωt and the k-th phase compensation signal φk.

The calculating unit 623 generates the third current given signal ih_dect* according to the m-th to the n-th harmonic current given signals from the m-th to the n-th inverse transform units 622. Moreover, the m-th to the n-th harmonic current given signals contain the k-th harmonic current given signal.

In another embodiment, the k-th forward transform unit 620 generates the k-th forward transform signal according to the sampling current idect, the k times fundamental wave phase signal ωt and the k-th phase compensation signal φk. Moreover, the k-th inverse transform unit 622 generates the k-th harmonic current given signal according to the k-th amplitude compensation signal and k times the fundamental wave phase signal wt.

In another embodiment, the k-th forward transform unit 620 generates the k-th forward transform signal according to the sampling current idect, k times the fundamental wave phase signal wt and the k-th phase compensation signal φk. Moreover, the k-th inverse transform unit 622 generates the k-th harmonic current given signal according to the k-th amplitude compensation signal, k times the fundamental wave phase signal $\omega t$ and the k-th phase compensation signal φk.

Moreover, the k-th forward transform unit and the k-th reverse transform unit are collaboratively formed as the k-th transform unit set. The k-th phase compensation signal can be provided to the k-th forward transform unit and/or the k-th inverse transform unit of the k-th transform unit set. In case that both of the k-th forward transform unit 620 and the k-th reverse transform unit 622 receive the k-th phase compensation signal φk, the k-th phase compensation signal φk received by the k-th forward transform unit 620 and the k-th phase compensation signal φk received by the k-th reverse transform unit 622 can be different signals.

In an embodiment, the m-th to the n-th amplitude compensation units 621 are controller, e.g., PI controllers.

In an embodiment, r is a specified harmonic order closest to the resonant frequency. The resonance frequency is determined according to the parameter of the active filter 4, the parameter of the passive filter 5, the parameter of the load 3 and the parameter of the power grid 2 collaboratively. If r is higher than k and k is higher than or equal to m (i.e., r>l≥m), the k-th phase compensation signal φk is zero. Whereas, if k is higher than or equal to r (i.e., k≥r), the k-th phase compensation signal φk is obtained according to the circuit parameter of the active filter 4, the current loop close-loop transfer function of the active filter 4, the grid impedance of the power grid 2 and the impedance of the passive filter 5.

In an embodiment, the hybrid compensation system 1 is a single-phase compensation system, and the sampling current idect is a single-phase sampling current. The forward transform unit 620 is a Fourier forward transform unit. The inverse transform unit 622 is a Fourier inverse transform unit. The forward transform unit 620 and the inverse transform unit 622 transform the received signals into the corresponding forward transform signal and the corresponding harmonic current given signal, respectively. Please refer to FIG. 4B. After a discrete Fourier transform (DFT) is performed, the forward transform unit 620 generates Fourier coefficients an and bn according to the single-phase sampling current (i.e., the single-phase current ia) and the fundamental wave phase signal wt. After the Fourier coefficients an and bn are subjected to amplitude compensation by the corresponding amplitude compensation unit 621, the compensated Fourier coefficients An and Bn are generated. The compensated Fourier coefficients An and Bn are applied into an inverse Fourier series by the corresponding inverse transform unit 622. Moreover, the phase signal $\omega t$ and the phase compensation signal φn are introduced into the inverse Fourier series. Consequently, the n-th inverse transform unit 622 has an inverse Fourier series An*cos(nωt+φn)+Bn*sin(nωt+φn). Moreover, the harmonic current given signal ihn* is generated according to the inverse Fourier series.

Figure 5A:
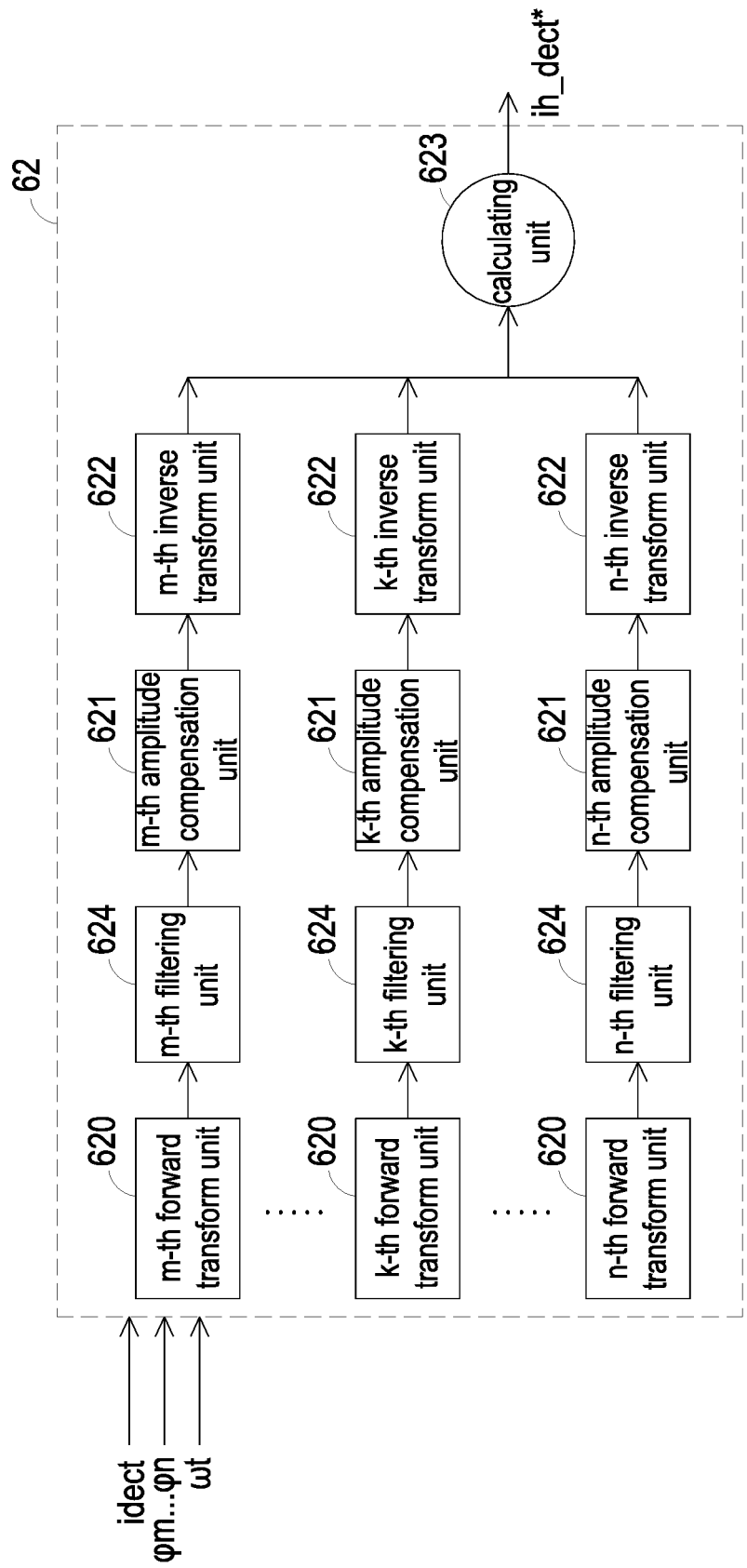
FIG. 5A is a schematic circuit block diagram illustrating a second exemplary architecture of the harmonic current compensator of the hybrid compensation system as shown in FIG. 1.
Figure 5B:
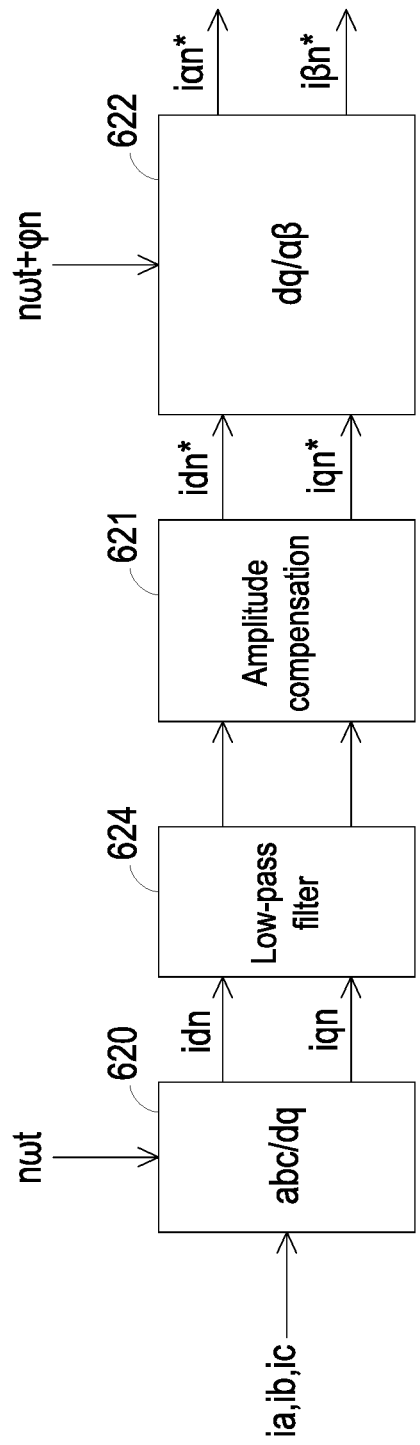
FIG. 5B schematically illustrates the computing structure of a forward transform unit, a filtering unit, an amplitude compensation unit and an inverse transform unit of the harmonic current compensator as shown in FIG. 5A.

Please refer to FIGS. 5A and 5B. FIG. 5A is a schematic circuit block diagram illustrating a second exemplary architecture of the harmonic current compensator of the hybrid compensation system as shown in FIG. 1. FIG. 5B schematically illustrates the computing structure of a forward transform unit, a filtering unit, an amplitude compensation unit and an inverse transform unit of the harmonic current compensator as shown in FIG. 5A. In this embodiment, the hybrid compensation system 1 is a three-phase compensation system, and the sampling current idect is a three-phase (a phase, b phase, c phase) sampling current. In comparison with the example of FIG. 4A, the harmonic current compensator 62 of this embodiment as shown in FIG. 5A further includes the m-th to the n-th filtering units 624. The m-th to the n-th filtering units 624 are respectively connected between the corresponding forward transform units 620 and the corresponding amplitude compensation units 621. That is, the k-th filtering unit 624 is connected between the k-th forward transform unit 620 and the k-th amplitude compensation unit 621. Preferably but not exclusively, the filtering units 624 are low-pass filters.

In this embodiment, the hybrid compensation system 1 is the three-phase compensation system. Each of the m-th to the n-th forward transform units 620 is an abc/dq transform unit for transforming the abc coordinate system into the d-q coordinate system so as to generate the corresponding forward transform signal. Each of the m-th to the n-th inverse transform units 622 is a dq/αβ transform unit for transforming the d-q coordinate system into the α-β coordinate system so as to generate the corresponding harmonic current given signal.

Please refer to FIG. 5B. The n-th forward transform unit 620 transforms the abc coordinate system into the d-q coordinate system to generate the forward transform signals idn and iqn according to the three-phase sampling current (ia, ib, ic) and the fundamental wave phase signal nωt. For example, the filtering unit 624 is the low-pass filter. After the forward transform signals idn and iqn are subjected to amplitude compensation by the amplitude compensation unit 621, compensated forward transform signals idn* and iqn* are generated. After the compensated forward transform signals idn* and iqn*, the signal $\omega t$ and the phase compensation signal φn are subjected to the d-q/α-β coordinate system transformation by the n-th inverse transform units 622, the harmonic current given signals iαn* and iβn* are generated.

Figure 6:
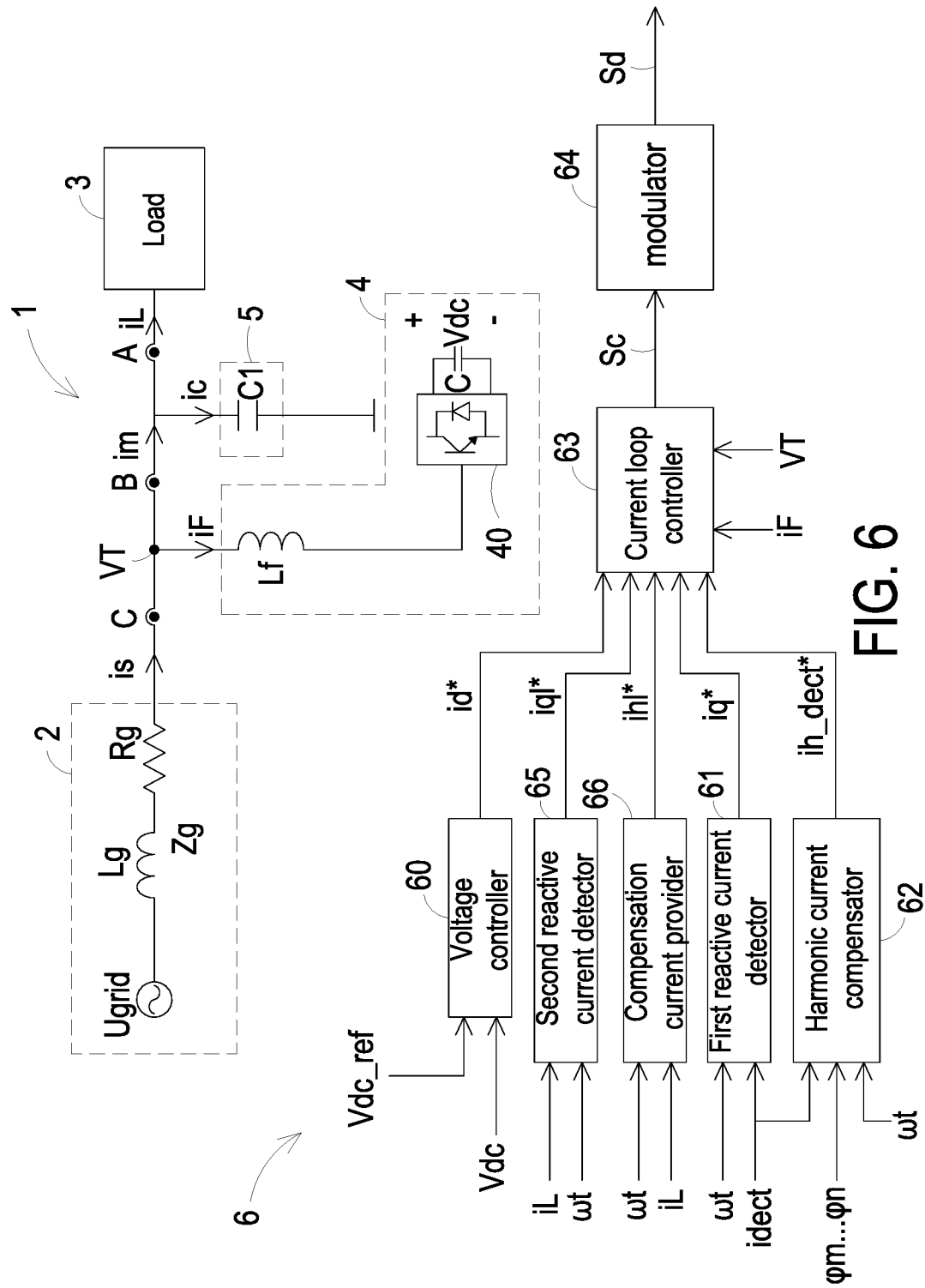
FIG. 6 schematically illustrates the architecture of a hybrid compensation system and a control unit of the hybrid compensation system according to a second embodiment of the present disclosure.

FIG. 6 schematically illustrates the architecture of a hybrid compensation system and a control unit of the hybrid compensation system according to a second embodiment of the present disclosure. In an embodiment, the sampling current idect received by the first reactive current detector 61 contains a first sampling current and a third sampling current. The current in the transmission line between the hybrid compensation system 1 and the power grid 2 is sampled as the first sampling current. The current in the transmission line between the hybrid compensation system 1 and the load 3 is sampled as the third sampling current. That is, the first sampling current is the grid current (is) (that is the C-point current), and the third sampling current is the load current iL (that is the A-point current).

In this embodiment, the sampling current idect contains the first sampling current and the third sampling current. In comparison with the first embodiment, the control unit 6 of the hybrid compensation system 1 of this embodiment further includes a second reactive current detector 65 and a compensation current provider 66. The second reactive current detector 65 generates a fourth current given signal iql* according to the third sampling current iL of the sampling current idect and the fundamental wave phase signal $\omega t$ of the grid voltage of the power grid 2. The compensation current provider 66 generates a fifth current given signal ihl* according to the third sampling current iL and the fundamental wave phase signal $\omega t$ of the grid voltage of the power grid 2. The compensation current provider 66 includes the harmonic extraction and given current generation link transfer function Ki(s) of the load current iL. The current loop controller 63 generates a control signal Sc according to the first current given signal id*, the second current given signal iq*, the third current given signal ih_dect*, the fourth current given signal iql*, the fifth current given signal ih1*, the output current iF of the active filter 4 and the voltage signal VT of the power grid 2.

Figure 7:
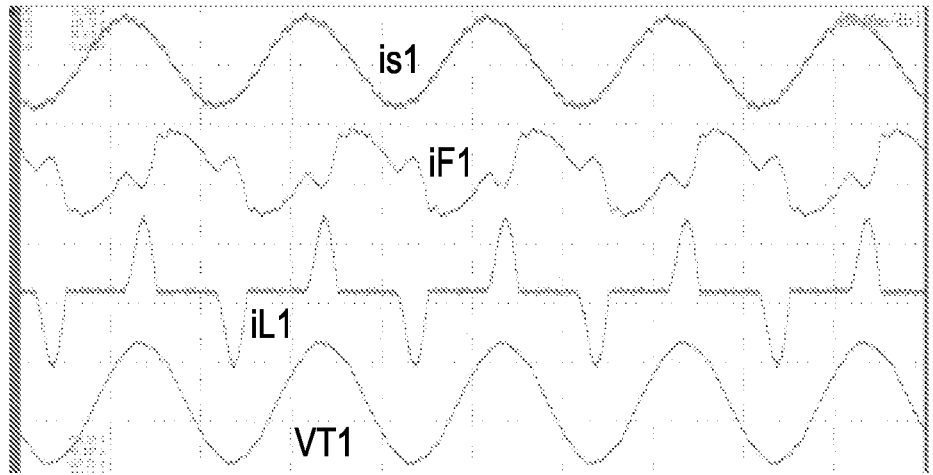
FIG. 7 is a simulation diagram illustrating the waveforms of the associated signals when the 11-th harmonic wave is compensated by a conventional hybrid compensation system without introducing the phase compensation and the capacitive passive filter is loaded out.
Figure 8:
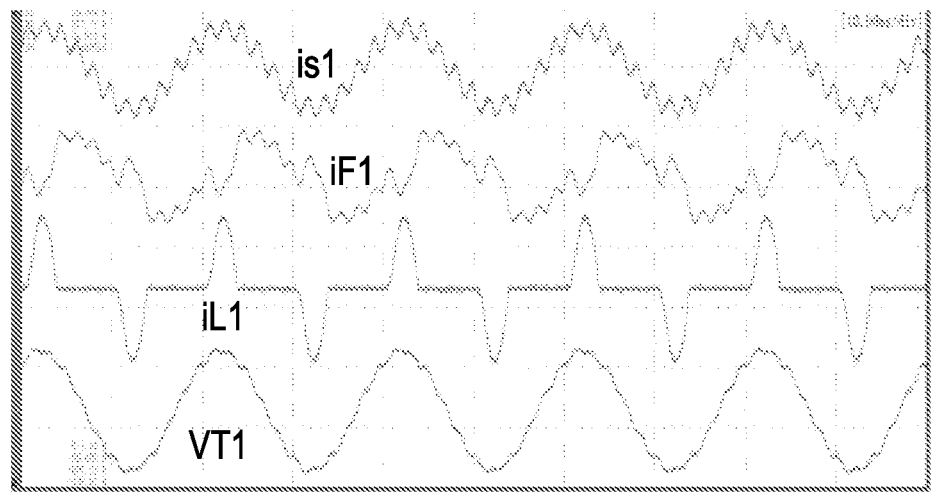
Figure 9:
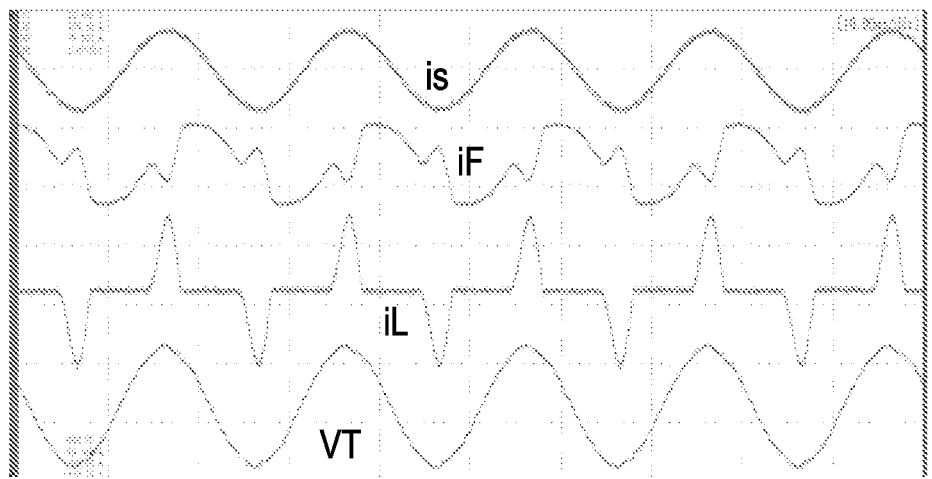
FIG. 9 is a simulation diagram illustrating the waveforms of the associated signals when the 11-th harmonic wave is compensated by the present hybrid compensation system introducing the phase compensation and the capacitive passive filter is loaded out.
Figure 10:
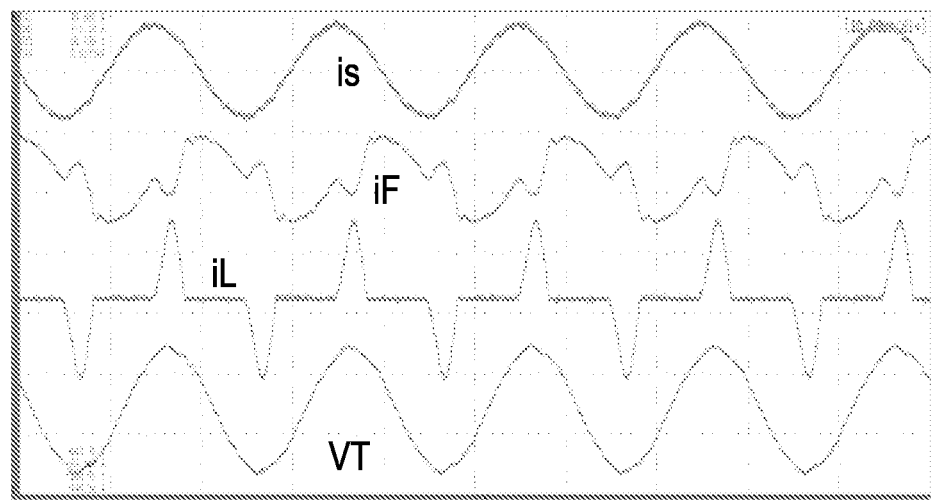

Please refer to FIGS. 7, 8, 9 and 10. FIG. 7 is a simulation diagram illustrating the waveforms of the associated signals when the 11-th harmonic wave is compensated by a conventional hybrid compensation system without introducing the phase compensation and the capacitive passive filter is loaded out. FIG. 8 is a simulation diagram illustrating the waveforms of the associated signals when the 11-th harmonic wave is compensated by a conventional hybrid compensation system without introducing the phase compensation and the capacitive passive filter is loaded in. FIG. 9 is a simulation diagram illustrating the waveforms of the associated signals when the 11-th harmonic wave is compensated by the present hybrid compensation system introducing the phase compensation and the capacitive passive filter is loaded out. FIG. 10 is a simulation diagram illustrating the waveforms of the associated signals when the 11-th harmonic wave is compensated by the present hybrid compensation system introducing the phase compensation and the capacitive passive filter is loaded in. For example, the third, fifth, seventh, ninth and eleventh harmonic waves are compensated by the conventional hybrid compensation system and the present hybrid compensation system, the harmonic order of the resonant frequency is 11, and the sampling current is the C-point current. The simulation results of the 11-th harmonic wave compensated by the conventional hybrid compensation system without introducing the phase compensation are shown in FIGS. 7 and 8. In FIGS. 7 and 8, the four waveforms are the grid current (is1), the output current of the active filter (iF1), the load current (iL1) and the grid voltage (VT1). In case that the capacitive passive filter is loaded out, the conventional hybrid compensation system is stable. Whereas, in case that the capacitive passive filter is loaded in, the conventional hybrid compensation system becomes instable, and the resonant phenomenon occurs at the 11-th harmonic wave. The simulation results of the 11-th harmonic wave compensated by the present hybrid compensation system introducing the phase compensation are shown in FIGS. 9 and 10. In FIGS. 9 and 10, the four waveforms are the grid current (is), the output current of the active filter (iF), the load current (iL) and the grid voltage (VT). When the hybrid compensation system 1 of the present disclosure introduces 90-degree phase compensation for the 11-th harmonic wave, the stability margin of the hybrid compensation system 1 is enhanced. Regardless of whether the passive filter 5 is loaded in or loaded out, the hybrid compensation system 1 is still stable. Moreover, the grid current (is) is smoother, the total harmonic distortion (THD) is reduced, and the compensation accuracy of the grid current is increased.

Figure 11:
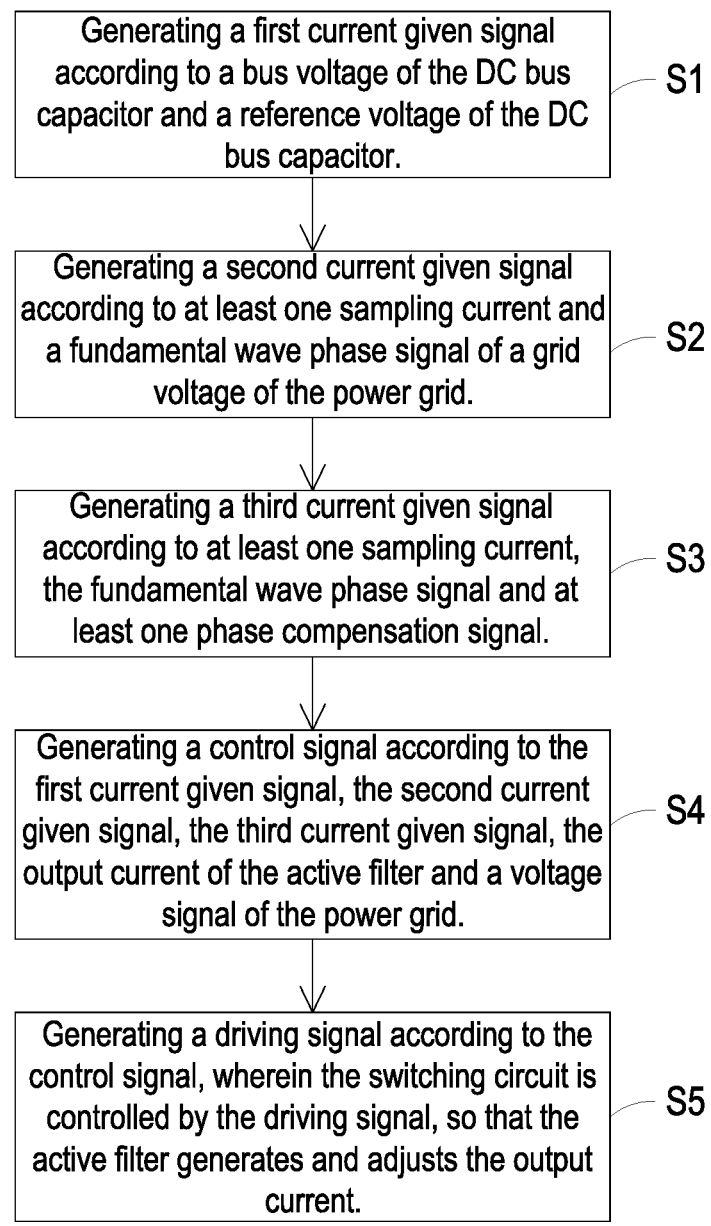
FIG. 11 is a flowchart of a control method for the hybrid compensation system as shown in FIG. 1 according to a first embodiment of the present disclosure.

FIG. 11 is a flowchart of a control method for the hybrid compensation system as shown in FIG. 1 according to a first embodiment of the present disclosure. The control method includes the following steps.

In a step S1, the voltage controller 60 of the control unit 6 generates a first current given signal id* according to a bus voltage Vdc of the DC bus capacitor C1 and a reference voltage Vdc_ref of the DC bus capacitor C1.

In a step S2, the first reactive current detector 61 of the control unit 6 generates a second current given signal iq* according to a sampling current idect and a fundamental wave phase signal ωt of a grid voltage of the power grid 2. Moreover, the sampling current idect is related to the current flowing through the transmission path between the power grid 2 and the load 3.

In a step S3, the harmonic current compensator 62 of the control unit 6 generates a third current given signal ih_dect* according to the sampling current idect, the fundamental wave phase signal ωt and at least one phase compensation signal φm . . . φn.

In a step S4, the current loop controller 63 of the control unit 6 generates a control signal Sc according to the first current given signal id*, the second current given signal iq*, the third current given signal ih_dect*, an output current iF of the active filter 4 and a voltage signal VT of the power grid 2.

In a step S5, the modulator 64 of the control unit 6 generates a driving signal Sd (e.g., a PWM driving signal) according to the control signal Sc. The operations of the switching circuit 40 is controlled by the driving signal Sd. Consequently, the output current iF is generated and adjusted by the active filter 4.

In the above embodiment, the steps S1, S2 and S3 are performed in any order.

In the above embodiment, the sampling current idect contains the first sampling current or contains the second sampling current.

In an embodiment, the step S3 includes a first sub-step, a second sub-step, a third sub-step and a fourth sub-step as follows. In the first sub-step, the k-th forward transform unit 620 in the m-th to the n-th forward transform units 620 of the harmonic current compensator 62 generates the k-th forward transform signal according to the sampling current idect and k times the fundamental wave phase signal ωt. In the second sub-step, the k-th amplitude compensation unit 621 in the m-th to the n-th amplitude compensation units 621 of the harmonic current compensator 62 generates the k-th amplitude compensation signal according to the k-th forward transform signal. In the third sub-step, the k-th inverse transform unit 622 in the m-th to the n-th inverse transform units 622 of the harmonic current compensator 62 generates the k-th harmonic current given signal according to the k-th amplitude compensation signal, k times the fundamental wave phase signal ωt and the k-th phase compensation signal. In the fourth sub-step, the calculating unit 623 of the harmonic current compensator 62 generates the third current given signal ih_dect* according to the m-th to the n-th harmonic current given signals from the m-th to the n-th inverse transform units 622. Moreover, the m-th to the n-th harmonic current given signals contain the k-th harmonic current given signal.

In another embodiment, the step S3 includes a first sub-step, a second sub-step, a third sub-step and a fourth sub-step as follows. In the first sub-step, the k-th forward transform unit 620 in the m-th to the n-th forward transform units 620 of the harmonic current compensator 62 generates the k-th forward transform signal according to the sampling current idect, k times the fundamental wave phase signal ωt of the grid voltage and the k-th phase compensation signal. In the second sub-step, the k-th amplitude compensation unit 621 in the m-th to the n-th amplitude compensation units 621 of the harmonic current compensator 62 generates the k-th amplitude compensation signal according to the k-th forward transform signal. In the third sub-step, the k-th inverse transform unit 622 in the m-th to the n-th inverse transform units 622 of the harmonic current compensator 62 generates the k-th harmonic current given signal according to the k-th amplitude compensation signal and k times the fundamental wave phase signal ωt. In the fourth sub-step, the calculating unit 623 of the harmonic current compensator 62 generates the third current given signal ih_dect* according to the m-th to the n-th harmonic current given signals from the m-th to the n-th inverse transform units 622. Moreover, the m-th to the n-th harmonic current given signals contain the k-th harmonic current given signal.

In another embodiment, the step S3 includes a first sub-step, a second sub-step, a third sub-step and a fourth sub-step as follows. In the first sub-step, the k-th forward transform unit 620 in the m-th to the n-th forward transform units 620 of the harmonic current compensator 62 generates the k-th forward transform signal according to the sampling current idect, k times the fundamental wave phase signal ωt of the grid voltage and the k-th phase compensation signal. In the second sub-step, the k-th amplitude compensation unit 621 in the m-th to the n-th amplitude compensation units 621 of the harmonic current compensator 62 generates the k-th amplitude compensation signal according to the k-th forward transform signal. In the third sub-step, the k-th inverse transform unit 622 in the m-th to the n-th inverse transform units 622 of the harmonic current compensator 62 generates the k-th harmonic current given signal according to the k-th amplitude compensation signal, k times the fundamental wave phase signal ωt and the k-th phase compensation signal. In the fourth sub-step, the calculating unit 623 of the harmonic current compensator 62 generates the third current given signal ih_dect* according to the m-th to the n-th harmonic current given signals from the m-th to the n-th inverse transform units 622. Moreover, the m-th to the n-th harmonic current given signals contain the k-th harmonic current given signal. In the embodiment, the phase compensation signal received by the forward transform unit and the compensation signal of the inverse transform unit can be different signals. For example, the phase compensation signal received by the forward transform unit and the compensation signal received by the inverse transform unit are two signals with different absolute values but the same sign or are two signals with the same absolute value but different signs.

Figure 12:
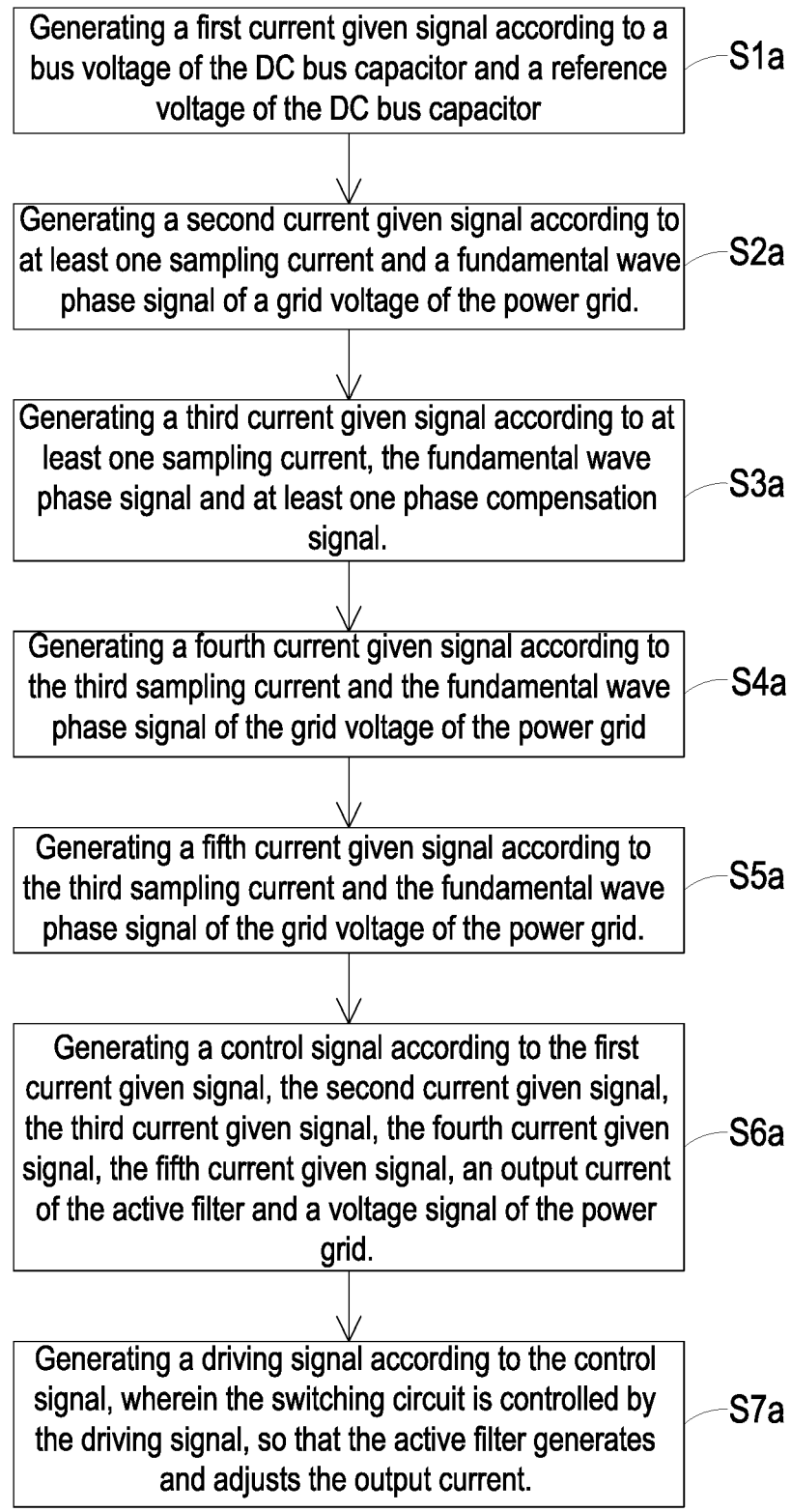
FIG. 12 is a flowchart of a control method for the hybrid compensation system as shown in FIG. 6 according to a second embodiment of the present disclosure.

FIG. 12 is a flowchart of a control method for the hybrid compensation system as shown in FIG. 6 according to a second embodiment of the present disclosure. In this embodiment, the sampling current idect contains the first sampling current and the third sampling current. The control method includes the following steps.

In a step S1a, the voltage controller 60 of the control unit 6 generates a first current given signal id* according to a bus voltage Vdc of the DC bus capacitor C1 and a reference voltage Vdc_ref of the DC bus capacitor C1.

In a step S2a, the first reactive current detector 61 of the control unit 6 generates a second current given signal iq* according to a sampling current idect and a fundamental wave phase signal ωt of a grid voltage of the power grid 2. Moreover, the sampling current idect is related to the current flowing through the transmission path between the power grid 2 and the load 3.

In a step S3a, the harmonic current compensator 62 of the control unit 6 generates a third current given signal ih_dect* according to the sampling current idect, the fundamental wave phase signal ωt and at least one phase compensation signal φm . . . φn.

In a step S4a, the second reactive current detector 65 of the control unit 6 generates a fourth current given signal iql* according to the third sampling current of the sampling current idect and the fundamental wave phase signal ωt of the grid voltage of the power grid.

In a step S5a, the compensation current provider 66 of the control unit 6 generates a fifth current given signal ihl* according to the third sampling current of the sampling current idect and the fundamental wave phase signal ωt of the grid voltage of the power grid.

In a step S6a, the current loop controller 63 of the control unit 6 generates a control signal Sc according to the first current given signal id*, the second current given signal iq*, the third current given signal ih_dect*, the fourth current given signal iql*, the fifth current given signal ihl*, an output current iF of the active filter 4 and a voltage signal VT of the power grid 2.

In a step S7a, the modulator 64 generates a driving signal Sd (e.g., a PWM driving signal) according to the control signal Sc. The operations of the switching circuit 40 is controlled by the driving signal Sd. Consequently, the output current iF is generated and adjusted by the active filter 4.

In the above embodiment, the steps S1a, S2a, S3a, S4a and S5a are performed in any order.

From the above descriptions, the present disclosure provides the hybrid compensation system and the control method for the hybrid compensation system. The hybrid compensation system and the control method refer to the phase lag introduced at the resonant frequency to be compensated and the harmonics above the resonant frequency to be compensated, and at least one phase compensation signal is provided to the harmonic current compensator. Consequently, the harmonic current compensator generates the third current given signal according to the sampling current idect and the at least one phase compensation signal. The control unit generates and adjusts the driving signal according to the at least one phase compensation signal. Consequently, the stability of the hybrid compensation system is enhanced, and the stability margin becomes wider. Moreover, regardless of whether the grid impedance of the power grid is changed, or the capacitive component of the load is loaded in or out, or the passive filter is loaded in or out, the hybrid compensation system is kept stable without adjusting the control parameters of the control unit. In other words, the hybrid compensation system of the present disclosure has strong adaptability to the changes of the power grid, the load and the passive filter, and improves the current compensation accuracy.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A hybrid compensation system electrically connected between a power grid and a load, the hybrid compensation system comprising:
   an active filter generating an output current, wherein the active filter comprises a switching circuit, a DC bus capacitor and a filtering inductor;
   a passive filter connected with the active filter in parallel; and
   a control unit configured to control the active filter and comprising:
      a voltage controller configured to generate a first current given signal according to a bus voltage of the DC bus capacitor and a reference voltage of the DC bus capacitor;
      a first reactive current detector configured to generate a second current given signal according to at least one sampling current and a fundamental wave phase signal of a grid voltage of the power grid, wherein the at least one sampling current is related to a current flowing between the power grid and the load;

a harmonic current compensator configured to generate a third current given signal according to the at least one sampling current, the fundamental wave phase signal and at least one phase compensation signal;

a current loop controller configured to generate a control signal according to the first current given signal, the second current given signal, the third current given signal, the output current of the active filter and a voltage signal of the power grid; and a modulator configured to generate a driving signal according to the control signal, wherein the switching circuit is controlled by the driving signal, so that the active filter generates and adjusts the output current.

2. The hybrid compensation system according to claim 1, wherein the at least one sampling current comprises a first sampling current, wherein the first sampling current is acquired by sampling a current in a transmission path between the power grid and the hybrid compensation system.

3. The hybrid compensation system according to claim 2, further comprising a third sampling current, wherein the third sampling current is acquired by sampling a current in a transmission path between the load and the hybrid compensation system.

4. The hybrid compensation system according to claim 3, wherein the control unit further comprises a second reactive current detector and a compensation current provider, wherein the second reactive current detector generates a fourth current given signal according to the third sampling current and the fundamental wave phase signal, the compensation current provider generates a fifth current given signal according to the third sampling current and the fundamental wave phase signal, and the current loop controller generates the control signal according to the first current given signal, the second current given signal, the third current given signal, the fourth current given signal, the fifth current given signal, the output current from the active filter and the voltage signal of the power grid.

5. The hybrid compensation system according to claim 1, wherein the passive filter is connected between the active filter and the load, and the at least one sampling current comprises a second sampling current, wherein the second sampling current is acquired by sampling a current in a transmission path between the active filter and the passive filter.

6. The hybrid compensation system according to claim 1, wherein the at least one phase compensation signal comprises a plurality of phase compensation signals, wherein the harmonic current compensator receives the at least one sampling current, the fundamental wave phase signal and the plurality of phase compensation signals, extracts an m-th to an n-th harmonic waves in the at least one sampling current, and compensates the m-th to the n-th harmonic waves according to the plurality of phase compensation signals, wherein m≥2, n≥m, and n and m are positive integers.

7. The hybrid compensation system according to claim 1, wherein the harmonic current compensator comprises an m-th to an n-th forward transform units, an m-th to an n-th amplitude compensation units, an m-th to an n-th inverse transform units and a calculating unit, and the at least one phase compensation signal comprises an m-th to an n-th phase compensation signals, wherein a k-th forward transform unit in the m-th to the n-th forward transform units generates a k-th forward transform signal according to the at least one sampling current, k times the fundamental wave phase signal and a k-th phase compensation signal, wherein a k-th amplitude compensation unit in the m-th to the n-th amplitude compensation units generates a k-th amplitude compensation signal according to the k-th forward transform signal, wherein a k-th inverse transform unit in the m-th to the n-th inverse transform units generates a k-th harmonic current given signal according to the k-th amplitude compensation signal and k times the fundamental wave phase signal, wherein the m-th to the n-th inverse transform units generate an m-th to an n-th harmonic current given signals correspondingly, and the calculating unit generates a third current given signal according to the m-th to the n-th harmonic current given signals, wherein k is a positive integer, m≥2, and n≥k≥m.

8. The hybrid compensation system according to claim 7, wherein when r>k≥m and r is a specified harmonic order closest to a resonant frequency, the k-th phase compensation signal is zero, wherein when k≥r, the k-th phase compensation signal is obtained according to a circuit parameter of the active filter, a current loop closed-loop transfer function of the active filter, a grid impedance of the power grid and an impedance of the passive filter.

9. The hybrid compensation system according to claim 7, wherein the hybrid compensation system is a single-phase compensation system, wherein each of the m-th to the n-th forward transform units is a Fourier forward transform unit, and each of the m-th to the n-th inverse transform units is a Fourier inverse transform unit.

10. The hybrid compensation system according to claim 7, wherein the hybrid compensation system is a three-phase compensation system, the harmonic current compensator further comprises an m-th to an n-th filter units, a k-th filter unit in the m-th to the n-th filter units is arranged between the k-th forward transform unit and the k-th amplitude compensation unit, wherein each forward transform unit is an abc/dq transform unit, and each inverse transform unit is a dq/αβ transform unit.

11. The hybrid compensation system according to claim 1, wherein the harmonic current compensator comprises an m-th to an n-th forward transform units, an m-th to an n-th amplitude compensation units, an m-th to an n-th inverse transform units and a calculating unit, and the at least one phase compensation signal comprises an m-th to an n-th phase compensation signals, wherein a k-th forward transform unit in the m-th to the n-th forward transform units generates a k-th forward transform signal according to the at least one sampling current and k times the fundamental wave phase signal, wherein a k-th amplitude compensation unit in the m-th to the n-th amplitude compensation units generates a k-th amplitude compensation signal according to the k-th forward transform signal, wherein a k-th inverse transform unit in the m-th to the n-th inverse transform units generates a k-th harmonic current given signal according to the k-th amplitude compensation signal, k times the fundamental wave phase signal and a k-th phase compensation signal, wherein the m-th to the n-th inverse transform units generate an m-th to an n-th harmonic current given signals correspondingly, and the calculating unit generates the third current given signal according to the m-th to the n-th harmonic current given signals, wherein k is a positive integer, m≥2, and n≥k≥m.

12. The hybrid compensation system according to claim 11, wherein when r>k≥m and r is a specified harmonic order closest to a resonant frequency, the k-th phase compensation signal is zero, wherein when k≥r, the k-th phase compensation signal is obtained according to a circuit parameter of the active filter, a current loop closed-loop transfer function of the active filter, a grid impedance of the power grid and an impedance of the passive filter.

13. The hybrid compensation system according to claim 11, wherein the hybrid compensation system is a single-phase compensation system, wherein each of the m-th to the n-th forward transform units is a Fourier forward transform unit, and each of the m-th to the n-th inverse transform units is a Fourier inverse transform unit.

14. The hybrid compensation system according to claim 11, wherein the hybrid compensation system is a three-phase compensation system, the harmonic current compensator further comprises an m-th to an n-th filter units, a k-th filter unit in the m-th to the n-th filter units is arranged between the k-th forward transform unit and the k-th amplitude compensation unit, wherein each forward transform unit is an abc/dq transform unit, and each inverse transform unit is a dq/αβ transform unit.

15. The hybrid compensation system according to claim 1, wherein the harmonic current compensator comprises an m-th to an n-th forward transform units, an m-th to an n-th amplitude compensation units, an m-th to an n-th inverse transform units and a calculating unit, and the at least one phase compensation signal comprises an m-th to an n-th phase compensation signals, wherein a k-th forward transform unit in the m-th to the n-th forward transform units generates a k-th forward transform signal according to the at least one sampling current, k times the fundamental wave phase signal and a k-th phase compensation signal, wherein a k-th amplitude compensation unit in the m-th to the n-th amplitude compensation units generates a k-th amplitude compensation signal according to the k-th forward transform signal, wherein a k-th inverse transform unit in the m-th to the n-th inverse transform units generates a k-th harmonic current given signal according to the k-th amplitude compensation signal, k times the fundamental wave phase signal and the k-th phase compensation signal, wherein the m-th to the n-th inverse transform units generate an m-th to an n-th harmonic current given signals correspondingly, and the calculating unit generates the third current given signal according to the m-th to the n-th harmonic current given signals, wherein k is a positive integer, m≥2, and n≥k≥m.

16. The hybrid compensation system according to claim 15, wherein when r>k≥m and r is a specified harmonic order closest to a resonant frequency, the k-th phase compensation signal is zero, wherein when k≥r, the k-th phase compensation signal is obtained according to a circuit parameter of the active filter, a current loop closed-loop transfer function of the active filter, a grid impedance of the power grid and an impedance of the passive filter.

17. The hybrid compensation system according to claim 15, wherein the hybrid compensation system is a single-phase compensation system, wherein each of the m-th to the n-th forward transform units is a Fourier forward transform unit, and each of the m-th to the n-th inverse transform units is a Fourier inverse transform unit.

18. The hybrid compensation system according to claim 15, wherein the hybrid compensation system is a three-phase compensation system, the harmonic current compensator further comprises an m-th to an n-th filter units, a k-th filter unit in the m-th to the n-th filter units is arranged between the k-th forward transform unit and the k-th amplitude compensation unit, wherein each forward transform unit is an abc/dq transform unit, and each inverse transform unit is a dq/αβ transform unit.

19. A control method for a control unit of a hybrid compensation system, the hybrid compensation system being electrically connected between a power grid and a load, the hybrid compensation system further comprising an active filter and a passive filter, the active filter generating an output current, the active filter comprising a switching circuit, a DC bus capacitor and a filtering inductor, the active filter being connected with the passive filter in parallel, the active filter being controlled by the control unit, the control method comprising steps of:
  (S1) generating a first current given signal according to a bus voltage of the DC bus capacitor and a reference voltage of the DC bus capacitor;
  (S2) generating a second current given signal according to at least one sampling current and a fundamental wave phase signal of a grid voltage of the power grid, wherein the at least one sampling current is related to a current flowing through a transmission path between the power grid and the load;
  (S3) generating a third current given signal according to the at least one sampling current, the fundamental wave phase signal and at least one phase compensation signal;
  (S4) generating a control signal according to the first current given signal, the second current given signal, the third current given signal, the output current of the active filter and a voltage signal of the power grid; and
  (S5) generating a driving signal according to the control signal, wherein the switching circuit is controlled by the driving signal, so that the active filter generates and adjusts the output current,
  wherein the steps (S1), (S2) and (S3) are performed in any order.

20. The control method according to claim 19, wherein the at least one sampling current comprises a first sampling current, wherein the first sampling current is acquired by sampling a current in a transmission path between the power grid and the hybrid compensation system.

21. The control method according to claim 20, wherein the at least one sampling current further comprises a third sampling current, and the third sampling current is acquired by sampling a current in a transmission path between the load and the hybrid compensation system.

22. The control method according to claim 21, further comprising steps of:
  (S6) generating a fourth current given signal according to the third sampling current and the fundamental wave phase signal; and
  (S7) generating a fifth current given signal according to the third sampling current and the fundamental wave phase signal,
  wherein in the step (S4), the control signal is generated according to the first current given signal, the second current given signal, the third current given signal, the fourth current given signal, the fifth current given signal, the output current from the active filter and the voltage signal of the power grid,
  wherein the steps (S6) and (S7) are performed before the step (S4), and the steps (S1), (S2), (S3), (S6) and (S7) are performed in any order.

23. The control method according to claim 19, wherein the passive filter is connected between the active filter and the load, and the at least one sampling current comprises a second sampling current, wherein the second sampling current is acquired by sampling a current in a transmission path between the active filter and the passive filter.

24. The control method according to claim 19, wherein the at least one phase compensation signal comprises a plurality of phase compensation signals, wherein a harmonic current compensator of the control unit receives the at least one sampling current, the fundamental wave phase signal and the plurality of phase compensation signals, extracts an m-th to an n-th harmonic waves in the at least one sampling current, and compensates the m-th to the n-th harmonic waves according to the plurality of phase compensation signals, wherein m≥2, n≥m, and n and m are positive integers.

25. The control method according to claim 19, wherein the at least one phase compensation signal comprises an m-th to an n-th phase compensation signals, and the step (S3) comprises:
- (S30) generating a k-th forward transform signal according to the at least one sampling current, k times the fundamental wave phase signal and a k-th phase compensation signal in the m-th to the n-th phase compensation signals;
- (S31) generating a k-th amplitude compensation signal according to the k-th forward transform signal;
- (S32) generating a k-th harmonic current given signal according to the k-th amplitude compensation signal and k times the fundamental wave phase signal; and
- generating an m-th to an n-th harmonic current given signals correspondingly according to the step (S30) to (S32), and generating the third current given signal according to the m-th to the n-th harmonic current given signals, wherein k is a positive integer, m≥2, and n≥k≥m.

26. The control method according to claim 25, wherein when r>k≥m and r is a specified harmonic order closest to a resonant frequency, the k-th phase compensation signal is zero, wherein when k≥r, the k-th phase compensation signal is obtained according to a circuit parameter of the active filter, a current loop closed-loop transfer function of the active filter, a grid impedance of the power grid and an impedance of the passive filter.

27. The control method according to claim 19, wherein the at least one phase compensation signal comprises an m-th to an n-th phase compensation signals, and the step (S3) comprises of:
- (S30a) generating a k-th forward transform signal according to the at least one sampling current and k times the fundamental wave phase signal;
- (S31a) generating a k-th amplitude compensation signal according to the k-th forward transform signal;
- (S31a) generating a k-th harmonic current given signal according to the k-th amplitude compensation signal, k times the fundamental wave phase signal and a k-th phase compensation signal of the m-th to an n-th phase compensation signals; and
- generating an m-th to an n-th harmonic current given signals correspondingly according to the step (S30a) to (S32a), and generating the third current given signal according to the m-th to the n-th harmonic current given signals, wherein k is a positive integer, m 2, and n k m.

28. The control method according to claim 19, wherein the at least one phase compensation signal comprises an m-th to an n-th phase compensation signals, and the step (S3) comprises of:
- (S30b) generating a k-th forward transform signal according to the at least one sampling current, k times the fundamental wave phase signal and a k-th phase compensation signal of the m-th to an n-th phase compensation signals;
- (S30b) generating a k-th amplitude compensation signal according to the k-th forward transform signal;
- (S30b) generating a k-th harmonic current given signal according to the k-th amplitude compensation signal, k times the fundamental wave phase signal and the k-th phase compensation signal; and
- generating an m-th to an n-th harmonic current given signals correspondingly according to the step (S30b) to (S32b), and generating the third current given signal according to the m-th to the n-th harmonic current given signals, wherein k is a positive integer, m≥2, and n≥k≥m.

* * * * *